(12) United States Patent
Heinz et al.

(10) Patent No.: US 7,872,398 B2
(45) Date of Patent: Jan. 18, 2011

(54) PIEZOELECTRIC ACTUATOR MODULE HAVING A SHEATH, AND A METHOD FOR ITS PRODUCTION

(75) Inventors: Rudolf Heinz, Renningen (DE); Dieter Kienzler, Leonberg (DE); Udo Schaich, Stuttgart (DE); Thomas Pauer, Freiberg (DE)

(73) Assignee: Robert Bosch GmbH, Stuttgart (DE)

( * ) Notice: Subject to any disclaimer, the term of this patent is extended or adjusted under 35 U.S.C. 154(b) by 142 days.

(21) Appl. No.: 12/294,282

(22) PCT Filed: Apr. 18, 2007

(86) PCT No.: PCT/EP2007/053753

§ 371 (c)(1),
(2), (4) Date: Sep. 24, 2008

(87) PCT Pub. No.: WO2007/122149

PCT Pub. Date: Nov. 1, 2007

(65) Prior Publication Data

US 2009/0200897 A1    Aug. 13, 2009

(30) Foreign Application Priority Data

Apr. 21, 2006  (DE) .................. 10 2006 018 703
Mar. 8, 2007   (DE) .................. 10 2007 011 315

(51) Int. Cl.
  *H01L 41/08* (2006.01)
(52) U.S. Cl. ..................................... 310/328
(58) Field of Classification Search ............ 310/340
  See application file for complete search history.

(56) References Cited

U.S. PATENT DOCUMENTS

| | | | |
|---|---|---|---|
| 4,553,059 A | 11/1985 | Abe et al. | |
| 7,595,579 B2 * | 9/2009 | Heinz et al. | 310/323.01 |
| 2003/0168937 A1 * | 9/2003 | Heinz et al. | 310/328 |
| 2005/0199745 A1 * | 9/2005 | Berlemont | 239/88 |
| 2006/0012266 A1 * | 1/2006 | Oakley et al. | 310/328 |
| 2006/0087202 A1 | 4/2006 | Flaemig-Vetter et al. | |
| 2008/0309197 A1 * | 12/2008 | Heinz et al. | 310/328 |
| 2009/0096324 A1 * | 4/2009 | Kronberger | 310/328 |

FOREIGN PATENT DOCUMENTS

| | | |
|---|---|---|
| DE | 19753930 A1 | 6/1999 |
| EP | 0319038 A2 | 6/1989 |
| WO | 2004006348 A2 | 1/2004 |
| WO | 2006106016 A1 | 10/2006 |

* cited by examiner

*Primary Examiner*—Mark Budd
(74) *Attorney, Agent, or Firm*—Ronald E. Greigg

(57) ABSTRACT

A piezoelectric actuator module having a multilayer structure of piezoelectric elements is proposed as a piezoelectric actuator, wherein a different polarity of an electric voltage is alternately applied to inner electrodes which are arranged between piezoelectric layers of the piezoelectric elements in the direction of the layer structure of the piezoelectric elements, said module having an actuator foot and an actuator head composed of steel and having an elastic insulation medium which surrounds at least the piezoelectric elements in predefined limits. At least one annular groove or recess, into which a material which can be crosslinked with the insulation medium is vulcanized, is provided on the actuator foot and/or on the actuator head, and a flexible, weldable hose or sheath lies encompasses the piezoelectric element, and at least above the grooves or recesses containing the material as an insulation medium the weldable hose is welded to the material in the grooves or recesses.

14 Claims, 3 Drawing Sheets

PIEZOELECTRIC ACTUATOR MODULE HAVING A SHEATH, AND A METHOD FOR ITS PRODUCTION

CROSS-REFERENCE TO RELATED APPLICATION

This application is a 35 USC 371 application of PCT/EP 2007/053753 filed on Apr. 18, 2007.

BACKGROUND OF THE INVENTION

1. Field of the Invention

The invention relates to a sheathed piezoelectric actuator module, bathed for instance by liquid media, and to a method for producing it.

2. Description of the Prior Art

It is known per se that for constructing the aforementioned piezoelectric actuator module, piezoelectric elements can be inserted in such a way that by utilizing what is known as the piezoelectric effect, control of the needle stroke of a valve or the like can be performed. Piezoelectric layers of the piezoelectric elements are constructed from a material having a suitable crystalline structure, in such a way that upon application of an external electrical voltage, a mechanical reaction of the respective piezoelectric element takes place, which as a function of the crystalline structure and of the regions where the electrical voltage is applied represents a compression or tension in a predeterminable direction. Such piezoelectric actuators formed of piezoelectric elements are suitable for instance for applications in which reciprocating motions take place in the presence of strong actuating forces and at high pulse frequencies.

For example, one such piezoelectric actuator module is known from German Patent Disclosure DE 10026005 A1, as a component of a pink, and can be used for triggering the nozzle needle in injectors for injecting fuel into the combustion chamber of an internal combustion engine. In this piezoelectric actuator module, a stack of a plurality of piezoelectric elements, coupled to one another electrically and mechanically, is constructed in such a way that the stack is held by initial tension between two stops via an actuator foot and an actuator head. Each piezoceramic piezoelectric layer is fixed between two inner electrodes, by way of which an electrical voltage can be applied from outside. Because of this electrical voltage, the piezoelectric elements then each execute short reciprocating motions in the direction of the potential gradient, and these motions are added together to make the total stroke of the piezoelectric actuator. This total stroke is variable by way of the level of the voltage applied and can be transmitted to a mechanical final control element.

Such known arrangements are often used as so-called common rail systems for introducing fuel into direct injection diesel engines. In these known systems, the injection pressure can be adapted to the load and rpm of the engine in a simple way.

These common rail injectors can be constructed in such a way that a nozzle needle controlled indirectly by the piezoelectric actuator is present, and the piezoelectric actuator module is surrounded directly or indirectly by the pressure of the fuel, and between the nozzle needle and the piezoelectric actuator module, only a hydraulic coupling chamber is provided. It is important that the relatively vulnerable piezoelectric actuator be protected, in the interior of a retaining body, from an overly high pressure load and from fluctuations in pressure or temperature. In addition, protection against mechanical shock or pressure is necessary, particularly with a view to electrical insulation and protection against moisture (diesel, water, RME or other electrically conductive substances), particles, or floating materials.

To achieve electrical and mechanical insulation of the piezoelectric actuator, sheath of the piezoelectric actuator is often proposed. From German Patent Disclosure DE 10230032 A1, to avoid the disadvantages described, an arrangement with a piezoelectric actuator in bathing media is known in which the piezoelectric elements are potted in a variable-shape insulation compound, which in turn is placed in a housing jacket that is solidly closed off from the medium laterally and at the upper and lower ends.

Viewed per se, it is known from a number of applications that with an elastic plastic extrusion coating, the piezoelectric actuator, for instance in a direct-switching pink in which the piezoelectric actuator module is exposed directly to the high pressure of the fuel inlet, can be protected against the harmful factors mentioned above. In these direct-switching pinks, only a mechanical coupler with a hydraulic booster is located between the piezoelectric actuator module and the nozzle needle, so that the needle motion follows the motion of the piezoelectric actuator in a directly boosted fashion, and in this case two-stage boosters are also possible.

In these known arrangements, the problem still exists of sealing off the coating material, as a rule plastic, from the steel attachment parts, such as the actuator head and foot on the face ends of the piezoelectric elements of the piezoelectric actuator. Either this sealing can usually be produced only in adhesive fashion, or the attachment is subject to the strength of adhesion of the coating materials to the steel parts.

The arrangements known for indirect control of the nozzle needle that have a piezoelectric actuator module in the low-pressure region of the fuel have metal sleeve sealing, which can be used here as a reciprocation- and temperature-compensating element. However, these arrangements cannot be adopted to applications with direct control of the nozzle needle. Because of the construction with a piezoelectric actuator module in the high-pressure region in the case of direct control, a rigid metal sleeve seal would not withstand the high system pressures and the longer reciprocating motions of the piezoelectric actuator, given the available space.

ADVANTAGES AND SUMMARY OF THE INVENTION

The invention is based on a piezoelectric actuator module as described at the outset, having a multilayer construction of piezoelectric elements as a piezoelectric actuator, in which inner electrodes disposed between piezoelectric layers of the piezoelectric elements are subjected in alternation, in the direction of the layer construction of the piezoelectric element, to a different polarity of an electrical voltage. To that end, a steel actuator foot and actuator head are present, and to protect against the bathing media, an elastic insulation medium surrounding at least the piezoelectric elements must be present. According to the invention, advantageously, there is at least one annular groove or recess on the actuator foot and/or on the actuator head, into which groove or recess a material that is connectable or cross-linkable with both the steel and with a hose or sleeve of plastic as an insulation medium is placed.

The material of the hose or sleeve cannot be connected directly to steel in a manner that is proof against high pressure over the required service life, since these materials have different coefficients of thermal expansion, and as a result, shear forces occur that lead to thrust cracks and leaks. Such a hose achieves the necessary sealing action relative to the piezoelectric elements and additionally assures compensation for both reciprocation and temperature expansion at temperatures from −40 to +160° C.

For example, if according to the invention a polymer or elastomer, as the material, is vulcanized onto the steel part, then the hose or sleeve can connect or cross-link to the material on the open ends by the effect of heat, such as UV light, laser, or oven heating. With the invention, the various materials can be designed especially to suit their requirements. This means that the polymer or elastomer for the vulcanizing can be adapted to the steel in a special way with regard to the thermal expansion and adhesion strength.

Thus with an economical, simple, durable seal of the hose ends, the entry of media is prevented over the service life of the piezoelectric actuator.

Advantageously, the grooves or recesses have a rectangular cross section, or even a trapezoidal cross section widening inward, so that the hold of the material that can be vulcanized onto the steel of the head or foot part in the actuator foot or actuator head is improved.

The connecting faces of the grooves or recesses on the actuator foot and/or on the actuator head to the material can advantageously each have corresponding toothing to increase the effective surface area, and these sets of teeth have a triangular, rectangular, or curved or pyramidal contour or have intersecting, transverse, or longitudinal grooves. It is also advantageous if between the actuator foot and/or head and the material, there is an annular holder having the applicable contour for receiving the material on the outside.

The aforementioned connecting faces and surface structures can be designed in terms of shape, thickness and width to suit the choice of material and available space.

In an advantageous method for producing the above-described piezoelectric actuator, first, before the assembly of the piezoelectric actuator module, a weldable plastic or a weldable plastic and rubber mixture, for example, is placed on the actuator foot and on the actuator head, in an annular groove of each. The piezoelectric actuator can be joined to the actuator foot and the actuator head and to the piezoelectric elements located between them. A flexible, weldable plastic hose can then be drawn over the piezoelectric actuator and connected or cross-linked, in particular welded, on one end.

In one version of the method, on one end a vacuum is generated and while under the vacuum, the other end of the plastic hose is welded to the plastic or plastic-rubber mixture there in the groove. The formation of the vacuum can for instance simultaneously serve as a tightness test for the first weld seam and optionally for the plastic hose.

In another version of the method, a flexible, weldable shrink-fit plastic hose is drawn over the piezoelectric actuator, and the plastic hose is welded on one end and pressed against the piezoelectric actuator by shrinkage. The other end of the plastic hose can then be welded here as well to the plastic or plastic-rubber mixture there in the groove.

The characteristics of the two variants mentioned above can also be combined, and in all cases, it can easily be assured that the coating of the piezoelectric actuator rests virtually entirely without air against the geometry of the piezoelectric actuator, so that the coating can withstand the possibly high pressures of the bathing medium and will not tear. Moreover, it can thus be assured that the coating can compensate elastically for the expansion from the stroke of the piezoelectric actuator in operation.

In a simple way, after the complete welding of the plastic hose to the plastic or plastic-rubber mixture in the grooves, the protruding ends of the plastic hose can be mechanically removed using a suitable cutting tool.

The invention can be realized advantageously above all because when steel components are used for the actuator foot and the actuator head, good steel-to-plastic connections can be made relatively easily that are known per se from the technology of vulcanization. Since such a method in the case of a coating of the piezoelectric element is disadvantageous because of the relatively high vulcanization temperatures, with the separate attachment to the actuator foot and/or the actuator head provided according to the invention, this procedure can be done separately from the assembly of the piezoelectric actuator.

BRIEF DESCRIPTION OF THE DRAWINGS

Exemplary embodiments of the piezoelectric actuator module of the invention will be described in detail in conjunction with the drawings, in which.

DESCRIPTION OF THE PREFERRED EMBODIMENTS

Figure 1:
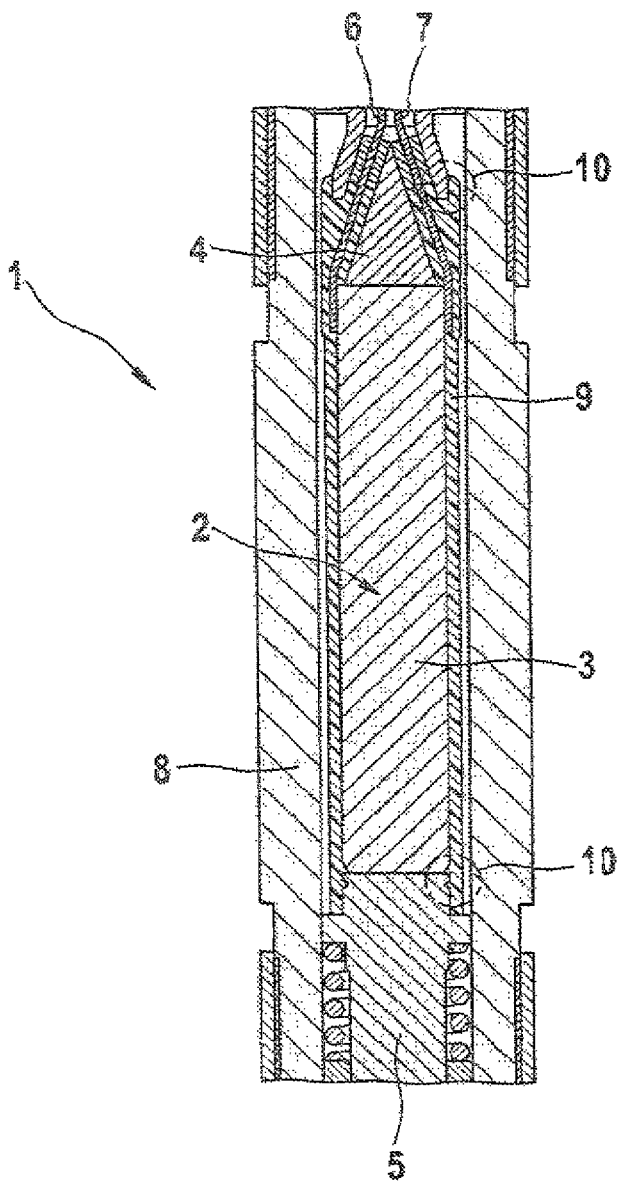
FIG. 1 is a section through parts of a pink with a sheathed piezoelectric actuator module having an actuator head, piezoelectric elements as a piezoelectric actuator, and an actuator foot, in a plastic hose.

In FIG. 1, an arrangement 1 is shown as a fragment of a pink with a piezoelectric actuator module, and this arrangement can for instance be used for needle stroke control in the injection system for fuel in an internal combustion engine. Piezoelectric elements 3 are a component of the piezoelectric actuator 2, which for forming the piezoelectric actuator module also has a steel actuator foot 4 and a steel actuator head 5. Electric lead lines 6 and 7 are extended through the actuator foot 4 and are put into electrical contact via outer electrodes with inner electrodes, not shown here, on the piezoelectric elements 3. Upon an actuation of the piezoelectric actuator 2 by subjection of the inner electrodes to voltage, a mechanical arrangement, located in this case vertically below the actuator foot 4, can be actuated in such a way that opening of a nozzle opening of the injection system in this case can be effected.

The arrangement 1 having the piezoelectric actuator 2 is installed in an injector body 8, shown here only in part, and the fuel is carried past the piezoelectric actuator module through the interior of the injector body. This fuel can then, for instance in a so-called common rail system, be injected, at the rail pressure mentioned in the background section or at some other predeterminable pressure into the combustion chamber of an internal combustion engine, not shown here.

To protect the piezoelectric actuator 2 from the fuel bathing it and against other harmful factors, a weldable hose or sheath 9 of plastic, rubber, or a mixture of the two materials is present, which in particular solidly surrounds the vulnerable piezoelectric elements 3 and is moreover connected to the actuator foot 4 and the actuator head 5 by way of a weld 10 described in further detail hereinafter.

Figure 2:
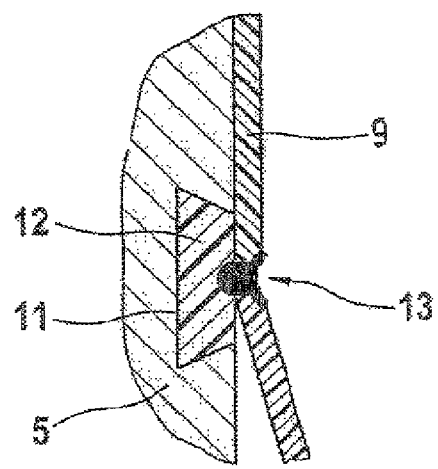
FIG. 2 is a detailed view of the connection point between the hose of FIG. 1 and a material in a groove of the actuator head that is connectable or cross-linkable to the hose.

In FIG. 2, the weld 10 on the actuator foot 4 or the actuator head 5 can be seen in detail; here there is an annular groove 11, in this case on the actuator foot 5, with a trapezoidal cross section, into which a weldable material 12, such as rubber, plastic, for instance a polymer or elastomer, or a mixture of these materials, is vulcanized.

To produce this piezoelectric actuator module described above, the piezoelectric actuator 2, after the vulcanization of the material 12 to the actuator foot 4, is joined to the actuator head 5. The flexible, weldable hose 9 is then drawn over the piezoelectric actuator 2 and welded with a weld seam 13 on one end, for example on the actuator foot 4 with the material 12 in the groove 11.

In a first variant, on the other end, in this case the actuator head 5, a vacuum can be generated, and under the vacuum, the other end of the hose 9 is welded to the material 12 in the groove 11, again forming a weld seam 13. Then again, the hose 9 instead also be a shrink-fit plastic hose, which is pressed by shrinkage against the piezoelectric actuator 2.

Figure 3:
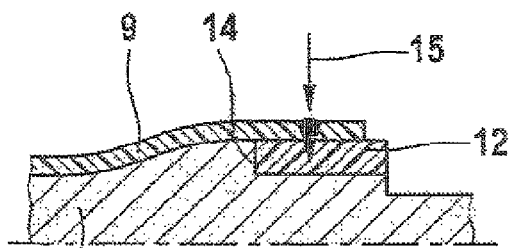
FIG. 3 is a detailed view of the connection point of FIG. 1 with a connectable or cross-linkable material in a recess of the actuator foot and with a welded point.

It can be seen from FIG. 3 how the material 12 is vulcanized in a recess 14 of the actuator foot 4. An arrow 15 indicates that in this case cross-linking of the hose 9 to the material 12 is done, for example by means of laser welding.

Figure 4:
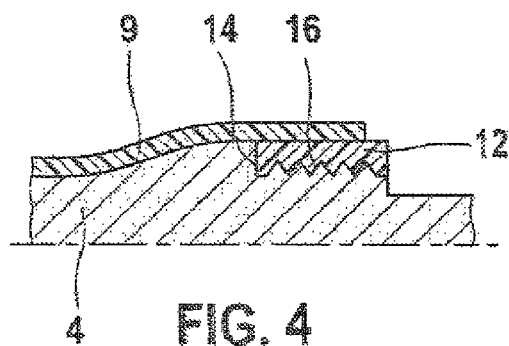
FIG. 4 shows a modification of the view in FIG. 3, with a toothing contour between the material in the recess and the actuator foot.
Figure 5:
FIG. 5 shows possible toothing contours for the version of FIG. 4.

FIG. 4 in conjunction with FIG. 5 shows how an enlargement of the connecting faces can be produced between the material 12 and the steel actuator foot 4 by means of a triangular toothing contour 16, a rectangular toothing contour 17, or a curved contour 18. Three-dimensional pyramidal contours or also intersecting, transverse, or longitudinal grooves, none of them shown here, are also possible.

Figure 6:
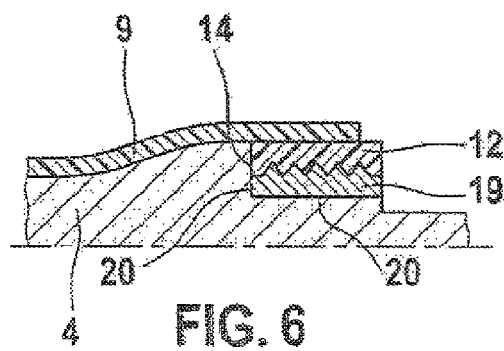
FIG. 6 shows a modification of the view in FIG. 4, with an annular holder.
Figure 7:
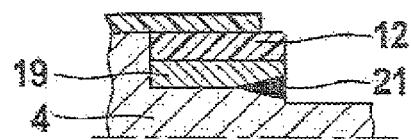
FIG. 7 shows a welded connection between the annular holder of FIG. 6 and the actuator foot.

In FIG. 6, the additional disposition of an annular holder 19 between the material 12 and the actuator foot 4 is shown, which can be glued for instance to the regions 20 or in accordance with FIG. 7 connected to the actuator foot 4 via a weld seam 21.

Figure 8:
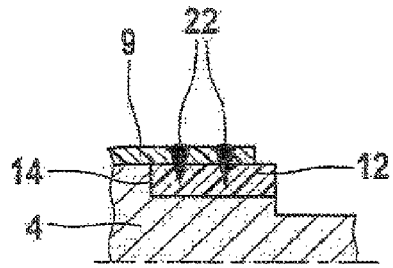
FIGS. 8 through 11 show various versions of the welded point of FIG. 3.
Figure 9:
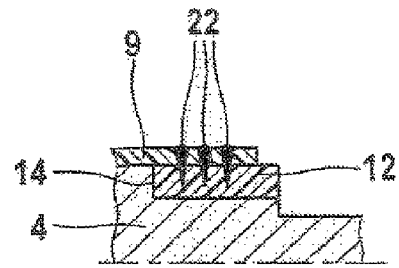
Figure 10:
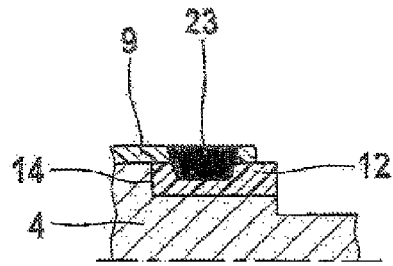
Figure 11:
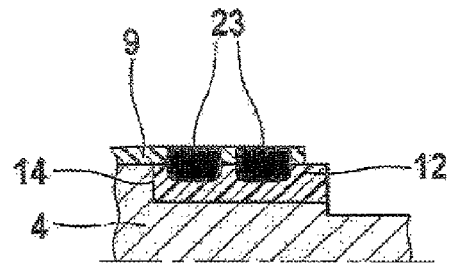

FIGS. 8 through 11 show various versions of cross-linking geometries as indicated by the arrow 15 in FIG. 3; FIG. 8 shows a two-track and FIG. 9 a multi-track, wedge-shaped and hence narrow, deep cross-linking geometry 22. FIG. 10 shows a single-track and FIG. 11 a two-track, approximately rectangular and thus wide and flat cross-linking geometry 23.

Figure 12:
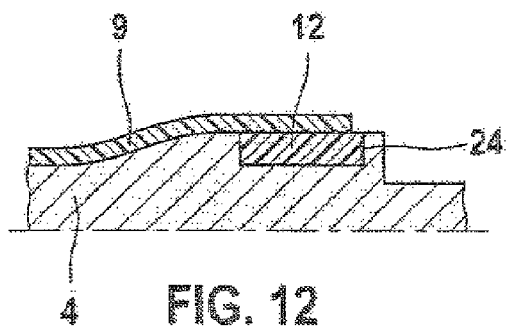
FIGS. 12 through 14 show various versions of the grooves with compartmentalization of the connectable or cross-linkable material in the groove of the actuator foot.
Figure 13:
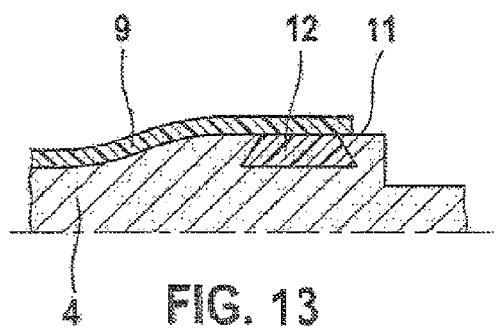
Figure 14:
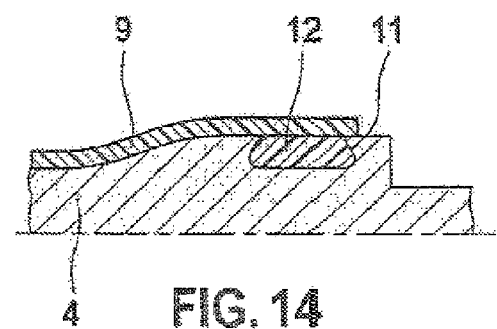

In FIG. 12, a first example can be seen for compartmentalization of the connectable or cross-linkable material 12 in a rectangular groove 24 of the actuator foot 4, and FIGS. 13 and 14 show versions of the trapezoidal groove 11, comparable to FIG. 2, which in FIG. 14 is slightly rounded on each of the corners.

The foregoing relates to the preferred exemplary embodiments of the invention, it being understood that other variants and embodiments thereof are possible within the spirit and scope of the invention, the latter being defined by the appended claims.

The invention claimed is:

1. A piezoelectric actuator module, comprising
a piezoelectric actuator having a multilayer construction of piezoelectric elements,
inner electrodes disposed between piezoelectric layers of the piezoelectric elements, the inner electrodes subjected in alternation to a different polarity of an electrical voltage in a direction of layer construction of the piezoelectric actuator,
an actuator foot and an actuator head both made of steel, and
an elastic insulation medium embodied as a flexible hose surrounding at least the piezoelectric elements within predetermined limits,
at least one annular groove or recess disposed on the actuator foot and/or on the actuator head, and
a material filling the groove or recess, the material being connectable or cross-linkable with the insulation medium, wherein at least above the at least one groove or recess having the material, the flexible hose is disposed and is connected to or cross-linked with the material in the groove or recess.

2. The piezoelectric actuator module as defined by claim 1, wherein the material is vulcanized into the grooves or recesses.

3. The piezoelectric actuator module as defined by claim 1, wherein that the material and/or the hose is a flexible plastic, preferably a polymer or elastomer, or a rubber, or a mixture of the two materials.

4. The piezoelectric actuator module as defined by claim 2, wherein that the material and/or the hose is a flexible plastic, preferably a polymer or elastomer, or a rubber, or a mixture of the two materials.

5. The piezoelectric actuator module as defined by claim 3, wherein the hose is formed of a plastic that is shrinkable under the influence of heat.

6. The piezoelectric actuator module as defined by claim 4, wherein the hose is formed of a plastic that is shrinkable under the influence of heat.

7. The piezoelectric actuator module as defined by claim 1, wherein the grooves or recesses have a rectangular cross section, or a cross section that on at least one end is trapezoidal.

8. The piezoelectric actuator module as defined by claim 1, wherein connecting faces of the material disposed the grooves or recesses on the actuator foot and/or the actuator head each have a corresponding toothing contour, which contours have a triangular, rectangular, curved, or pyramidal contour, or have intersecting, transverse, or longitudinal grooves for increasing the effective surface area.

9. The piezoelectric actuator module as defined by claim 7, wherein an annular holder is disposed between material and the actuator foot and/or the actuator head.

10. The piezoelectric actuator module as defined by claim 8, wherein an annular holder is disposed between material and the actuator foot and/or the actuator head.

11. The piezoelectric actuator module as defined by claim 9, wherein the annular holder is welded or glued or soft-soldered to the actuator foot and/or the actuator head at a seam thereof.

12. The piezoelectric actuator module as defined by claim 10, wherein the annular holder is welded or glued or soft-soldered to the actuator foot and/or the actuator head at a seam thereof.

13. The piezoelectric actuator module as defined by claim 1, wherein at the flexible hose is cross-linked, preferably welded, to the material in the grooves or recesses by means of two- or multi-track, wedgelike, rectangular or trapezoidal cross-linking geometries.

14. The use of a piezoelectric actuator module as defined by claim 1, wherein the piezoelectric actuator module is a component of a piezoelectric actuator for an injection system for fuel in an internal combustion engine, and wherein the fuel bathes the hose.

* * * * *